(12) United States Patent
Carpentier et al.

(10) Patent No.: US 7,525,400 B2
(45) Date of Patent: Apr. 28, 2009

(54) BAND PASS FILTERING CIRCUIT FITTED WITH ACOUSTIC RESONATORS

(75) Inventors: Jean-Francois Carpentier, Grenoble (FR); Cyrille Tilhac, Soudaine Lavinadiere (FR)

(73) Assignee: STMicroelectronics S.A., Montrouge (FR)

( * ) Notice: Subject to any disclaimer, the term of this patent is extended or adjusted under 35 U.S.C. 154(b) by 299 days.

(21) Appl. No.: 11/427,591

(22) Filed: Jun. 29, 2006

(65) Prior Publication Data

US 2007/0030099 A1 Feb. 8, 2007

(30) Foreign Application Priority Data

Jul. 1, 2005 (FR) .................................. 05 07037

(51) Int. Cl.
*H03H 9/56* (2006.01)
(52) U.S. Cl. ....................................... 333/189; 333/193
(58) Field of Classification Search .................. 333/186, 333/188–190, 193
See application file for complete search history.

(56) References Cited

U.S. PATENT DOCUMENTS

| | | | |
|---|---|---|---|
| 3,697,903 A | 10/1972 | Sauerland | |
| 5,036,299 A | 7/1991 | Dick et al. | 331/25 |
| 5,043,681 A | 8/1991 | Tanemura et al. | 331/107 |
| 5,235,640 A | 8/1993 | Devries et al. | 380/13 |
| 5,446,306 A | 8/1995 | Stokes et al. | 257/416 |
| 5,608,360 A | 3/1997 | Driscoll | 331/107 A |
| 5,714,917 A | 2/1998 | Ella et al. | 332/144 |
| 6,653,913 B2 * | 11/2003 | Klee et al. | 333/188 |
| 6,917,789 B1 * | 7/2005 | Moloudi et al. | 455/78 |
| 6,950,639 B2 | 9/2005 | Gogolla et al. | 455/196.1 |
| 7,030,718 B1 | 4/2006 | Scherer | 333/188 |
| 7,065,331 B2 | 6/2006 | Korden et al. | 455/150.1 |
| 7,135,940 B2 * | 11/2006 | Kawakubo et al. | 333/17.1 |
| 7,187,240 B2 | 3/2007 | Cathelin et al. | 333/2 |
| 7,218,181 B2 | 5/2007 | Razafimandimby et al. | 333/107 |
| 7,274,274 B2 | 9/2007 | Carpentier et al. | 333/188 |

(Continued)

FOREIGN PATENT DOCUMENTS

DE 10234685 2/2004

(Continued)

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisbon, Portugal, Sep. 7-10, 1998, pp. 157-160.

(Continued)

*Primary Examiner*—James H Cho
(74) *Attorney, Agent, or Firm*—Lisa K. Jorgenson; Robert Iannucci; Seed IP Law Group PLLC

(57) ABSTRACT

A band pass filtering circuit based on a quadripole includes a serial branch having a first acoustic resonator presenting a frequency of resonance and a frequency of anti-resonance and mounted in serial with a first capacitor; a parallel branch having a second acoustic resonator resulting from the same manufacturing process as the first resonator and mounted in parallel with a second capacitor of identical value to that the first capacitor. The filtering circuit is particularly but not exclusively adapted to the realization of integrated filtering circuits used in mobile telephony.

20 Claims, 6 Drawing Sheets

U.S. PATENT DOCUMENTS

| | | | |
|---|---|---|---|
| 7,319,371 B2 * | 1/2008 | Ten Dolle et al. | 333/188 |
| 7,345,554 B2 | 3/2008 | Cathelin et al. | 331/154 |
| 2001/0028277 A1 | 10/2001 | Northam | 331/34 |
| 2004/0227578 A1 | 11/2004 | Hamalainen | 331/107 |
| 2005/0266823 A1 | 12/2005 | Cathelin et al. | 455/344 |

FOREIGN PATENT DOCUMENTS

| | | |
|---|---|---|
| FR | 2455816 | 11/1980 |
| FR | 2864726 | 7/2005 |
| FR | 2864728 | 7/2005 |
| FR | 2864729 | 7/2005 |
| FR | 2864733 | 7/2005 |
| GB | 615 841 | 1/1949 |
| JP | 10-294636 | 11/1998 |
| WO | 02/25813 | 3/2002 |
| WO | 2004/066495 | 8/2004 |

OTHER PUBLICATIONS

Bradley, P., et al., "A Film Bulk Acoustic Resonator (FBAR) Duplexer for USPCS Handset Applications," IEEE MTT-Symposium, pp. 367-370, 2001.

Carpentier, J. F., et al., "21.3—A SiGe:C BiCMOS WCDMA Zero-IF RF Front-End Using an Above-IC BAW Filter," IEEE International Solid-State Circuits Conference, pp. 394-395, 2005.

Carpentier, J. F., et al., "A Tunable Bandpass BAW-Filter Architecture and Its Application to WCDMA Filter," IEEE MTT-Symposium, pp. 221-224, 2005, no month.

De Los Santos, H., FR MEMES Circuit Design for Wireless Communications, "5.3 Film Bulk Acoustic Wave Filters," Artech House, 2002, pp. Cover-IV and 163-167, no month.

Gopinathan, V., et al., "Design Considerations for High-Frequency Continuous-Time Filters and Implementation of an Antialiasing Filter for Digital Video," IEEE Journal of Solid-State Circuits, vol. 25, No. 6, pp. 1368-1378, Dec. 1990.

Karsilayan, A., et al., "Automatic Tuning of Frequency and Q-Factor of Bandpass Filters Based on Envelope Detection," ISCAS '98, Proceedings of the 1998 IEEE International Symposium on Circuits and Systems, pp. 65-68, 1998, no month.

Koroglu, M., et al., "A 1.9Ghz Image-Reject Front-End with Automatic Tuning in a 0.15μm CMOS Technology," in Proceedings of the IEEE Int'l. Solid State Circuits Conference, San Francisco, CA, Feb. 9-13, 2003, pp. 1-10.

Lakin, K. M., et al., "Improved Bulk Wave Resonator Coupling Coefficient for Wide Bandwidth Filters," IEEE Ultrasonics Symposium, pp. 827-831, 2001, no month.

Li, D., et al., "Design Techniques for Automatically Tuned Integrated Gigahertz-Range Active LC Filters," IEEE Journal of Solid-State Circuits, vol. 37, No. 8, pp. 967-977, Aug. 2002.

Razafimandimby, S., et al., "Nouvelle Configuration de filtre RF accordable en frequence utilisant des resonateurs BAW pour une chaine de reception homodyne WCDMA," 6e Colloque TAISA 2005, 4 pages, no month.

Razafimandimby, S., et al. "A Novel Architecture of a Tunable Bandpass BAW-filter for a WCDMA Transceiver," Analog Integr. Circ. Sig. Process, vol. 49, pp. 237-247, 2006, no month.

Schmidhammer, E., et al., "Design Flow and Methodology on the Design of BAW Components," IEEE MTT-Symposium, pp. 233-236, 2005, no month.

Tilhac, C., et al., "A Bandpass BAW-Filter Architecture with Reduced Sensitivity to Process Variations," IEEJ Analog VLSI Workshop 2005, 5 pages, no month.

Ueda, M., et al., "High-Q Resonators Using FBAR/SAW Technology and their Applications," IEEE MTT-Symposium, pp. 209-212, 2005, no month.

Vale, G., et al., "FBAR Filters at GHz Frequencies," Forty-Fourth Annual Symposium on Frequency Control, Westinghouse Electric Corp., IEEE, 1990, pp. 332-336, no month.

* cited by examiner

Only depends on resonator

Resonator + serial capacity

$$\omega_p = \sqrt{\frac{1}{Lm \times Cm}} \times \sqrt{\frac{Cm + C0}{C0}} \qquad \omega_s = \sqrt{\frac{1}{Lm \times Cm}} \times \sqrt{\frac{Cm + C0 + C}{C0 + C}}$$

Resonator + parallel capacity

$$\omega_p = \sqrt{\frac{1}{Lm \times Cm}} \times \sqrt{\frac{Cm + C0 + C}{C0 + C}} \qquad \omega_s = \sqrt{\frac{1}{Lm \times Cm}}$$

BAND PASS FILTERING CIRCUIT FITTED WITH ACOUSTIC RESONATORS

TECHNICAL FIELD

The present disclosure generally relates to electronic circuits and more specifically but not exclusively to a band pass filtering circuit fitted with acoustic resonators.

BACKGROUND INFORMATION

Acoustic resonators are today very widespread in applications for the general public but also in professional applications because of their efficiency, in particular for the realization of very powerful band-pass filters, and specifically in mobile telephony for the selection of transmission channels.

A classical manner to carry out a band pass filter comprises utilizing two acoustic resonators, having slightly shifted characteristics, and assembling them in serial/parallel for the purpose of constituting an elementary filtering cell. FIG. 2a illustrates such a known circuit where it can be seen a first resonator 10 (fs1) mounted in serial and a second resonator 20 (fs2) in parallel within the same quadripole. FIG. 2b illustrates the curves characteristic of each of these resonators and the curve of the resulting filter band pass.

This permits a particularly narrow band pass filter to be achieved, which can thus be combined with other elementary cells for the purpose of assembling a more complex filter.

Researches have been made on two types of acoustic resonators which present remarkable performances, namely the resonators of type SAW (Surface Acoustic Wave Resonator) and, more recently, those of type BAW (Bulk Acoustic Wave Resonator). In the first type, the acoustic resonator is positioned on the surface of a semiconductor product while, in the second type, it is positioned inside a volume delimited between a lower electrode and a higher electrode so that the acoustic wave develops in that same volume. BAW type resonators are the subject of intensive investigation and research by the manufacturers of semi conductor products because these components allow to consider a very thorough integration of filtering circuits and, by consequence, let foresee a significant reduction of the manufacturing costs for these circuits.

However, it remains that the realization of an acoustic filter made of two resonators having characteristics being slightly shifted shows to be particularly delicate because of the constraints weighing on the precision of the manufacturing process. Indeed, it is necessary to be able to realize, for each filtering cell, not only one resonator but a set of two resonators of which each one presents precise characteristics in order to guarantee a suitable frequency shift allowing to obtain the desired characteristics curve. The high level of precision which is required calls for critical manufacturing steps within the manufacturing process of the band pass filter. More particularly, it is necessary to consider the manufacturing of two identical resonators, then a stage of "overloading" of one of the two resonators.

Practically, the addition of a layer above the higher electrode permits the frequencies of resonance to be shifted. Then a posterior treatment of type "trimming" by laser ablation is executed, which intervenes after the passivation of that circuit. This process entails a disadvantage which is the fact that it does not allow to correct individually each of the resonators because the laser beam is too much broad. We can thus only correct in a more or less uniform way the set of resonators of the filter without knowing the effect produced on each resonator individually; loaded or not.

Such operations are complex, delicate and expensive to implement.

In order to avoid the constraint on the manufacturing process, one may contemplate the use BAW or similar adjustable type resonator, for the purpose of adjusting the characteristics of the component. French Patent Application No. 03 15480 entitled "INTEGRABLE ACOUSTIC RESONATOR, AND PROCESS OF INTEGRATION OF SUCH RESONATOR," filed on Dec. 29, 2003 (corresponding to U.S. patent application Ser. No. 11/025,599, filed on Dec. 29, 2004 (agent's reference 852263.415) describes an Adjustable Resonator Component comprising a resonator type BAW to which an inductance is associated, judiciously selected in the vicinity of one of the frequencies of resonance, and an adjustable capacity allowing to shift and to correct the global frequency of the resonator.

This already permits a significant achievement in the overall process of integration of a BAW type resonator in a semiconductor product. However, it shows to be not so easily exploitable in a simple and low-cost process. It should be particularly noticed the significant space occupied by the inductances required for the implementation of that technique.

In other known circuits, the difficulty is overcome by simply suppressing one among the two resonators of the filtering quadripole and by substituting a capacitor as shown in FIG. 3a illustrating a known circuit, comprising a resonator 30 (fs1) mounted in the serial branch of the quadripole, and associated to a capacitor 40 located in the parallel branch. In certain cases, as it can be seen in the figure, in order to improve rejection, it can be useful to use another capacitor 50 connected in parallel on the terminals of the resonator. In both cases, one can simplify the manufacturing process because one can avoid the need to manufacture a filtering cell made up of two resonators having precise and slightly shifted characteristics. On the other hand, as it can be seen in FIG. 3b, the response curve of such a quadripole has not the exact profile which is looked for and this is a major drawback.

FIG. 4a illustrates the dual embodiment based on a capacitor 60 on the serial branch, followed by a resonator 70 on the parallel branch, sometimes associated with a capacitor 80 being in parallel with the resonator. It results another filtering cell from it of which the curve is represented in FIG. 4b.

The circuits which were mentioned above, if they avoid the need of integrating two resonators having slightly shifted characteristics, do not permit a satisfactory filtering circuit to be obtained. Should the designer really wish to have the two "zero" which are characteristics of the transfer function of the filter, then it will be necessary to use the "classical" cell of FIG. 2a and to cope with the disadvantages of this cell which were mentioned above.

BRIEF SUMMARY

There is a wish for an alternative solution, for carrying out a filtering circuit that is easy to manufacture and which provides an appropriate profile in the perspective of an easy integration of a band pass filter within a semi-conductor product.

This is the technical problem which is solved by one or more embodiments of the present invention.

One embodiment of the present invention achieves a band pass filtering circuit equipped with acoustic resonators which are easy to integrate within the same semi conductor product.

Another embodiment of the present invention achieves a band pass filtering structure which is easy to integrate and fitted with two acoustic resonators, such as BAW resonators—for example—that results from the same manufacturing process.

A further embodiment of the present invention achieves a simplified manufacturing process of an integrated circuit comprising a filter band pass based on two BAW resonators resulting from a same manufacturing process.

An embodiment provides an elementary filtering cell based on a quadripole, which comprises:
- on its serial branch, the association in serial of a first acoustic resonator with a first capacitor,
- on its parallel branch, the association in parallel of a second resonator identical to the first resonator with a second capacitor being identical to the first capacitor.

The two resonators and the two condensers being perfectly identical, this results in the fact—and this is particularly remarkable—that the frequency of resonance on the serial branch corresponds with the frequency of anti resonance of the parallel branch. They compensate perfectly and this results in the possibility of achieving a powerful filter band pass, and that by the means of the two resonators perfectly identical, which show to be easier to integrate within the same semi conductor product.

In one embodiment, the resonators are BAW type resonators and it will be useful to combine a cascade of identical quadripoles permitting a particularly efficient band pass filter to be achieved.

One embodiment of the invention is particularly adapted to the realization of a filter of channels selection for mobile telephony.

BRIEF DESCRIPTION OF THE DRAWINGS

Other characteristics and features of one or more embodiments of the invention will appear when reading the description and the drawings here below, provided only as non restrictive examples. On the annexed drawings:

FIG. 2b illustrates respectively the impedance curves (module of impedance in dB) and gain curves (S21 in dB) of the filter of FIG. 2a.

FIG. 3b illustrates the characteristic curve of the filter of FIG. 3a.

FIG. 4b illustrates the characteristic curve of the filter of FIG. 4a.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It will now be described one or more embodiments of the invention based on BAW resonators, which allows a better possibility of integration because of their compatibility with the manufacturing process "Very Large Scale Integration" (VLSI). Clearly, a person skilled in the art will straightforwardly adapt the teaching of the embodiment(s) to any other type of acoustic resonators.

Figure 1A:
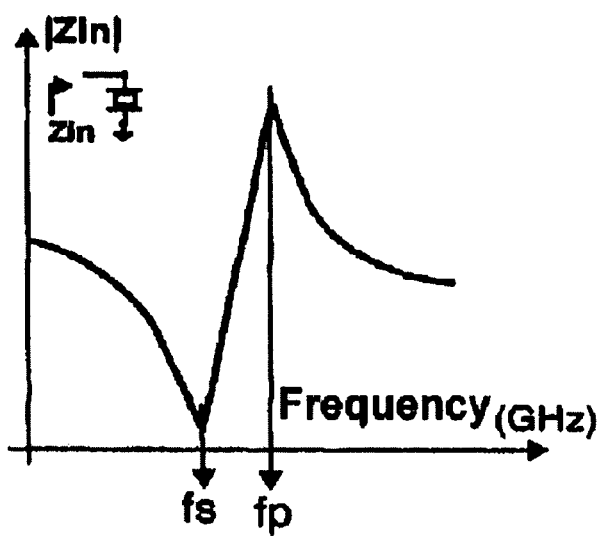
FIG. 1a is a curve representing the impedance module in dB of an example BAW type acoustic resonator and which highlights the two example frequencies of resonance and anti resonance.
Figure 1B:
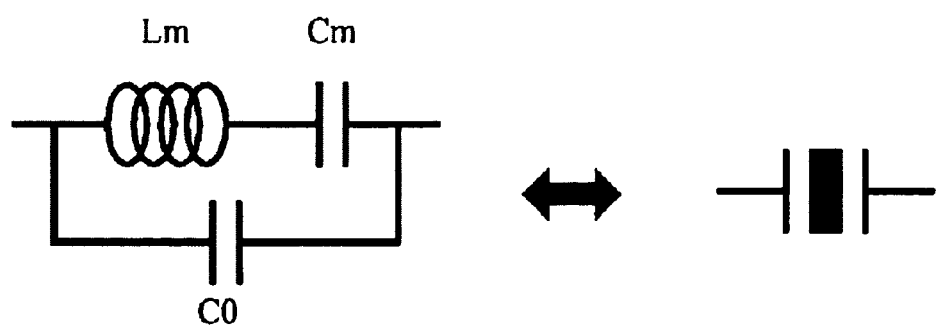
FIG. 1b illustrates the equivalent electrical scheme of a BAW type acoustic resonator.
Figure 2A:
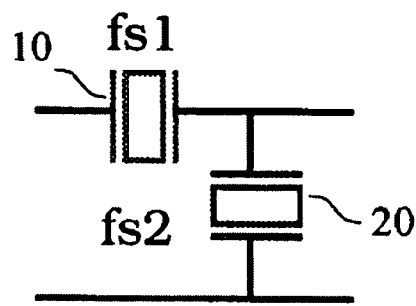
FIG. 2a illustrates a known elementary filter band pass made of two acoustic resonators, being respectively in serial and parallel.
Figure 2B:
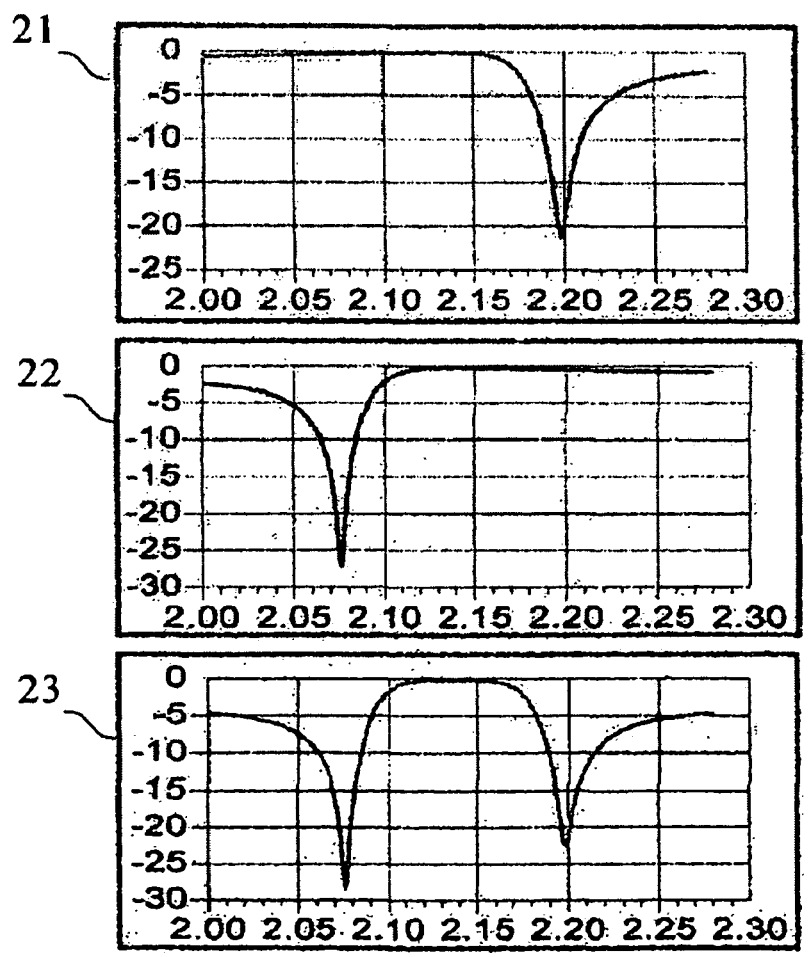
Figure 3A:
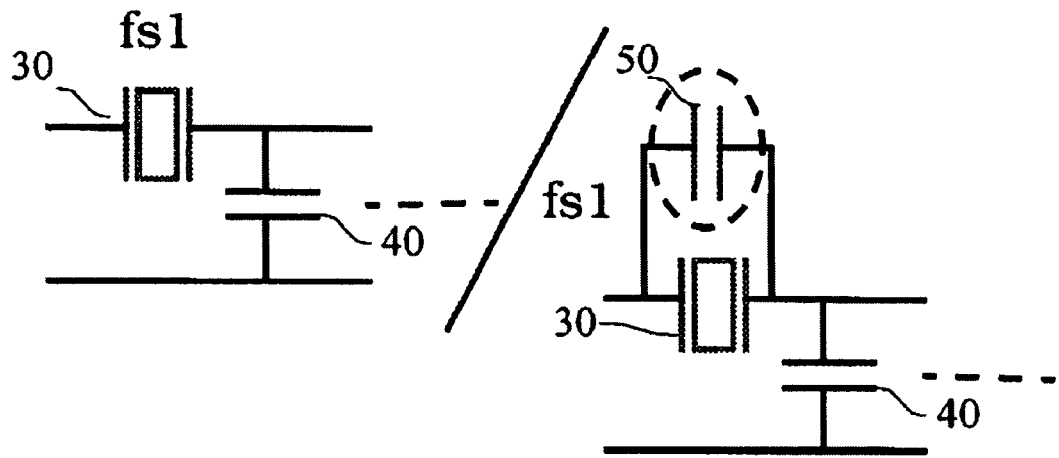
FIG. 3a illustrates another known elementary filter based on a resonator in serial and a capacitor in parallel.
Figure 3B:
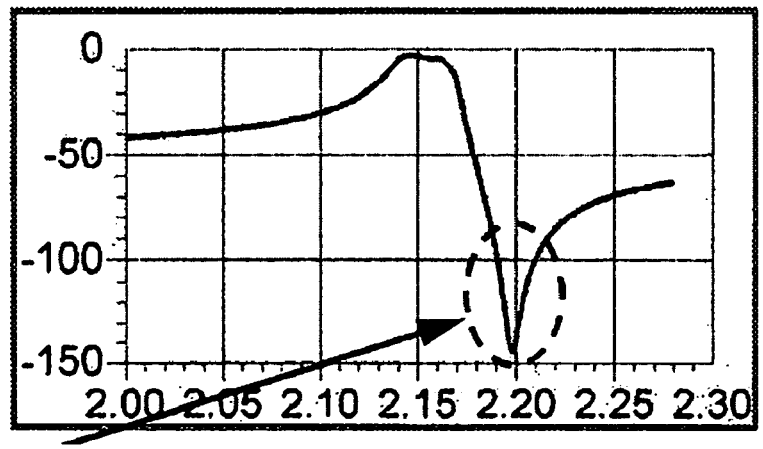
Figure 4A:
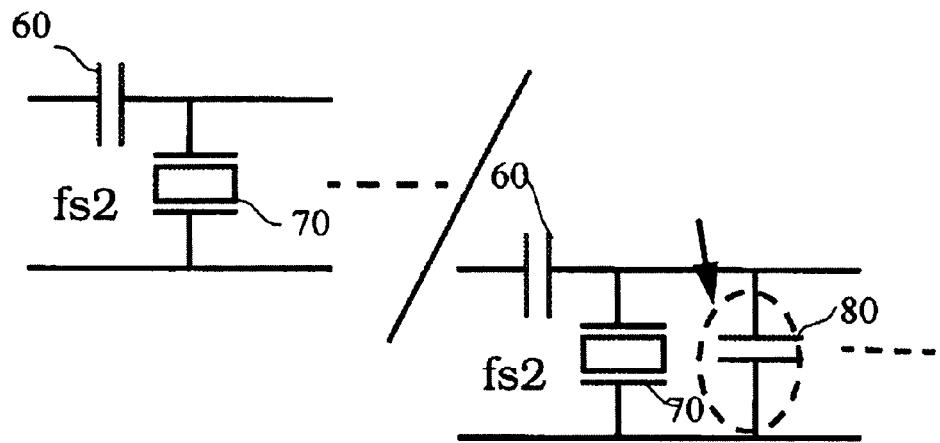
FIG. 4a illustrates a third known elementary filter based on a capacitor in serial and a resonator in parallel.
Figure 4B:
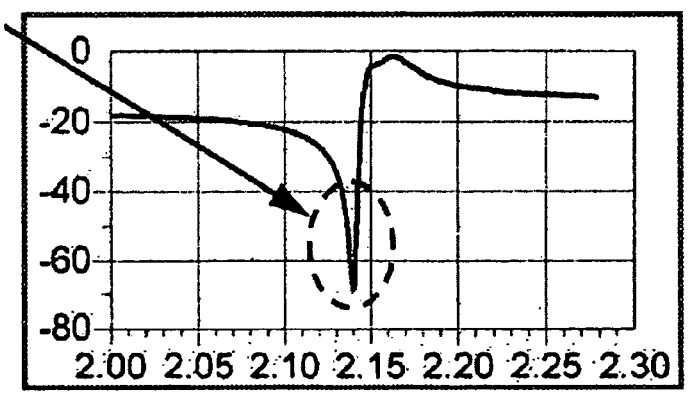

The acoustic resonators present two frequencies of resonance very closed, respectively fs (serial) and fp (parallel), as illustrated in FIG. 1a. If one is reduced to an equivalent electrical diagram presented in FIG. 1b, that amounts considering two resonator circuits of type LC, respectively serial and parallel, with the components Lm, Cm, C0.

Figure 5:
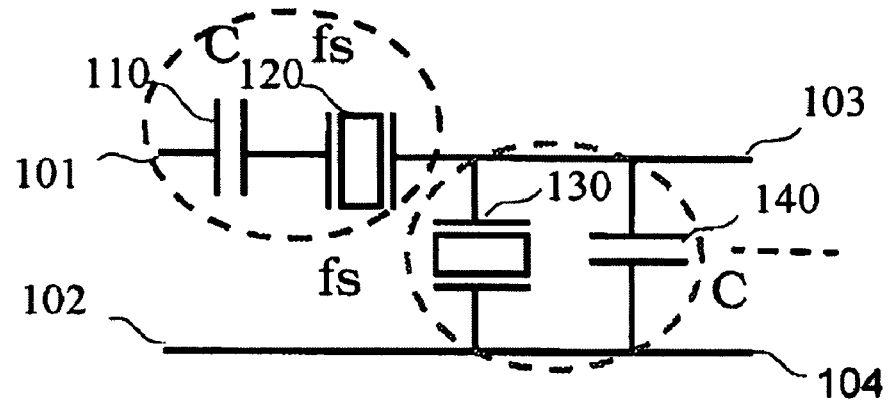
FIG. 5 illustrates a band pass filtering circuit in according to one embodiment of the present invention.

FIG. 5 illustrates the detail of a band pass filtering cell which complies to one embodiment of the present invention. The cell takes the form of a quadripole comprising two entries or inputs 101 and 102, two outputs 103 and 104. Input 101 is connected to a first terminal of a capacitor 110, a second terminal of which is connected to a first terminal of a first resonator 120. Resonator 120 has a second terminal connected to the output 103 of the cell, but also to a first terminal of a second acoustic resonator 130 and to a first terminal of a second capacitor 140. The second terminals of resonator 130 and of capacitor 140 are connected to entry 102 and to output 104.

As it can be seen, the association of resonator 120 and capacitor 110 is mounted in the serial branch of the quadripole, while resonator 130 and its associated capacitor 140 are mounted in the parallel branch of that same quadripole.

Acoustic resonators 120 and 130 are two resonators of BAW type (Bulk Acoustic Resonator) resulting from the same manufacturing process in order to guarantee identical electrical characteristics. While resonators BAW present the advantage of allowing a better integration within a semi conductor product, it is not excluded for a person skilled in the art carry out the filtering cell using two SAW (Surface Acoustic Resonator) type acoustic resonators.

In the same manner, capacitors 110 and 140 are chosen so as to present a same capacity value C. By preference, one realizes the two capacitors 110 and 140 using passive components in order to avoid noise and non linearity phenomena created by active components such as transistors. In this way, there is obtained a passive filter. Alternatively, capacitors 110 and 140 can be carried out using junction capacities of MOS transistors.

One notices that the two resonators 120 and 130 (fs), by hypothesis identical, are more easily realized than the classical cell based on two shifted resonators. In particular, it is not necessary to consider a step of deposition of an extra layer on one of the two resonators, nor the possible trimming of that same layer by a laser to ensure a precise and suitable thickness of that extra layer, thus achieving the desired shift between the two resonators. Even when a step of trimming is being considered in one embodiment of the invention, one may notice that because the two resonators are identical, this step will identically affect the two resonators, what was not made possible in the classical approach.

It has been seen, and this is an advantageous effect made possible by the present invention, that capacitor 110 which is placed in serial with resonator 120 has for effect to shift the frequency of resonance (or serial frequency) of the latter.

Correlatively, capacitor 140, mounted in parallel on the resonator 130 entails the shifting of the frequency of anti resonance (or parallel frequency) of the latter.

Figure 6:
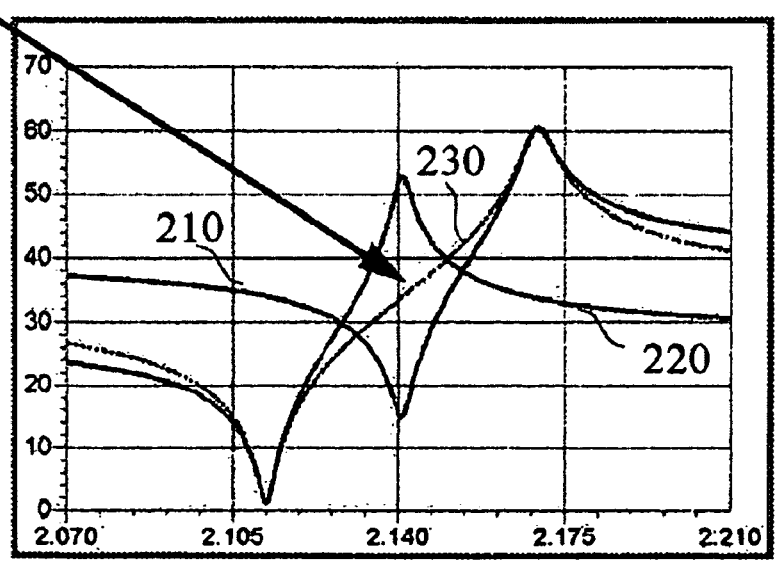
FIG. 6 illustrates example impedance curves of the two resonator blocks of one embodiment of the circuit of FIG. 5.

What is even more remarkable is that these shifts lead to an intermediary frequency, as it can be seen on the example of FIG. 6 which shows a intermediary frequency 2.140 Ghz, being a common frequency for the two resonators.

FIG. 6 shows particularly the impedance curves of the two branches, respectively that of the serial branch 110-120 (curve 210) and that of the parallel branch 130-140 (curve 220). The curve 230 is the impedance curve of a single resonator (120 or 130).

This significant property is shown in a formal manner. Indeed, considering curve 210 of the serial branch 110-120, we can show that the serial frequencies (resonance) and parallel (anti resonance) are given by the following formula:

$$\omega_p = \sqrt{\frac{1}{Lm \times Cm}} \times \sqrt{\frac{Cm + C0}{C0}}$$

and $$\omega_s = \sqrt{\frac{1}{Lm \times Cm}} \times \sqrt{\frac{Cm + C0 + C}{C0 + C}}$$

Considering curve 200 of the parallel branch 130-140, the two frequencies serial and parallel are given by the following formula:

$$\omega_p = \sqrt{\frac{1}{Lm \times Cm}} \times \sqrt{\frac{Cm + C0 + C}{C0 + C}}$$

and $$\omega_s = \sqrt{\frac{1}{Lm \times Cm}}$$

One may notice that the serial frequency of curve 210 and the parallel frequency of curve 220 are identical. As it can be seen in FIG. 6, the serial frequency of curve 210 and the parallel frequency of curve 220 shows to be ruled by a same mathematical formula when capacities 110 and 140 are identical.

On the other side, the parallel frequencies of the serial branch (curve 210) and serial of the parallel branch (curve 220) enable to constitute the two "zeros" which permits the required band pass filter to be achieved. One may notice that these two frequencies are only dependent of the common characteristics of the two resonators 120 and 130.

Figures 7, 8:
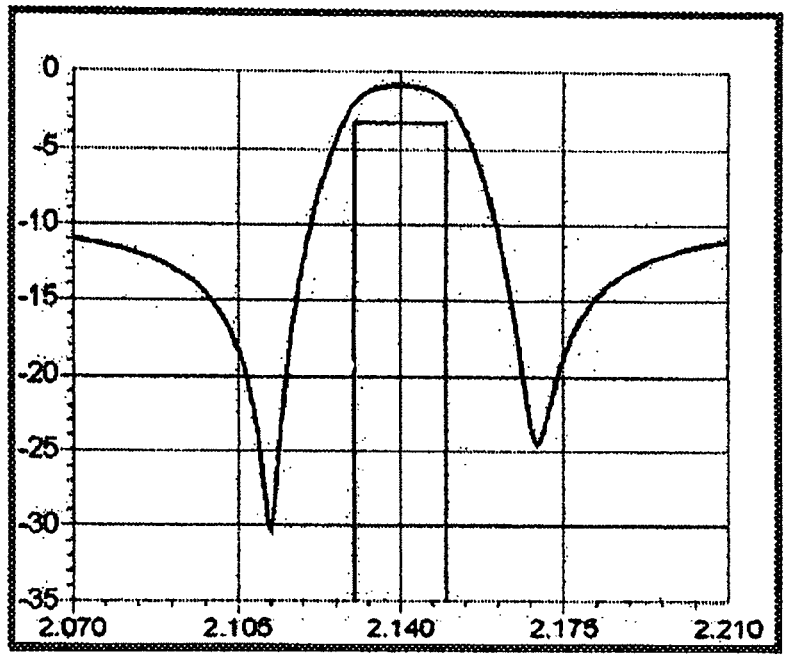
FIG. 7 shows an example characteristic curve of one embodiment of the filter of FIG. 5.
FIG. 8 shows the detail of the computation formulas of frequency of resonance and anti resonance for each of the serial blocks (resonator+ capacity serial) and parallel blocks (resonator+ capacity parallel) according to an embodiment.

FIG. 7 illustrates the gain curve of the band pass filter based on the quadripole of FIG. 5, which, as seen, shows the appropriate profiled which is required. Such filtering cell can be mounted in cascade in order to embody a more powerful filter.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A band pass filtering circuit based on a quadripole, the band pass filtering circuit comprising:
    a serial branch including a first acoustic resonator having a frequency of resonance and mounted in series with a first capacitor to shift said frequency of resonance; and
    a parallel branch including a second acoustic resonator having a frequency of anti-resonance and resulting from a same manufacturing process of said first acoustic resonator and mounted in parallel with a second capacitor to shift said frequency of anti-resonance of said second acoustic resonator, wherein both said first and second acoustic resonators have substantially same electrical characteristics and wherein the second capacitor has a same capacitance as that of said first capacitor so that a serial resonance frequency of said serial branch corresponds with a parallel resonance frequency of parallel branch.

2. The band pass filtering circuit according to claim 1 wherein the band pass filtering circuit comprises part of a cascade arrangement.

3. The band pass filtering circuit according to claim 1 wherein said first and second acoustic resonators are BAW type resonators.

4. The band pass filtering circuit according to claim 3 wherein said BAW resonators are integrated inside a same semi-conductor product.

5. The band pass filtering circuit according to claim 1 wherein said first and second capacitors are realized by passive type capacitors.

6. The band pass filtering circuit according to claim 1 wherein said first and second capacitors are realized by junction capacitors of MOS transistors.

7. The band pass filtering circuit as defined in claim 1 wherein the band pass filtering circuit comprises part of a mobile telephone and is usable for selection of channels.

8. The band pass filtering circuit as defined in claim 1 wherein the band pass filtering circuit comprises part of a receiver for a wireless communication system and is usable for selection of channels.

9. A band pass filter apparatus, comprising:
a first acoustic resonator;
a first capacitor, coupled in series with the first acoustic resonator in a serial branch, to shift a frequency of resonance of said first acoustic resonator;
a second acoustic resonator; and
a second capacitor, coupled in parallel with the second acoustic resonator in a parallel branch, to shift a frequency of anti-resonance of said second acoustic resonator,
wherein said first and second acoustic resonators result from a same manufacturing process to provide substantially same electrical characteristics for the first and second acoustic resonators, and wherein said second capacitor has substantially a same capacitance as the first capacitor so that a serial resonance frequency of said serial branch corresponds with a parallel resonance frequency of said parallel branch.

10. The apparatus of claim 9 wherein the first and second acoustic resonators are BAW type resonators.

11. The apparatus of claim 9 wherein the first and second capacitors are passive-type capacitors.

12. The apparatus of claim 9 wherein the capacitance of the first and second capacitors are provided by a capacitance from at least one transistor.

13. The apparatus of claim 9, further comprising:
first and second input terminals; and
first and second output terminals, wherein:
the second input terminal is coupled to the second output terminal;
the first input terminal is coupled to the first capacitor; and
the first output terminal is coupled to the first acoustic resonator, and to the second acoustic resonator and to the second capacitor.

14. The apparatus of claim 9 wherein said serial resonance frequency, of said serial branch having the first capacitor and the first acoustic resonator coupled in series, corresponds with said parallel resonance frequency, of said parallel branch having the second capacitor and the second acoustic resonator coupled in parallel, by being identical.

15. The apparatus of claim 9 wherein the first and second acoustic resonators are integrated within a same semiconductor product.

16. The apparatus of claim 9 wherein the first acoustic resonator is a SAW type resonator, and wherein the second acoustic resonator is a SAW type resonator.

17. A mobile telephone, comprising:
a receiver; and
an integrated circuit included in said receiver, the integrated circuit having at least one band pass filter that includes:
a first acoustic resonator;
a first capacitor, coupled in series with the first acoustic resonator in a serial branch, to shift a frequency of resonance of said first acoustic resonator;
a second acoustic resonator; and
a second capacitor, coupled in parallel with the second acoustic resonator in a parallel branch, to shift a frequency of anti-resonance of said second acoustic resonator,
wherein said first and second acoustic resonators result from a same manufacturing process to provide substantially same electrical characteristics for the first and second acoustic resonators, and wherein said second capacitor has substantially a same capacitance as the first capacitor so that a serial resonance frequency of said serial branch is made identical to a parallel resonance frequency of said parallel branch.

18. The mobile telephone of claim 17 wherein the first and second capacitors are passive-type capacitors.

19. The mobile telephone of claim 17 wherein said first and second acoustic resonators are BAW type resonators.

20. The mobile telephone of claim 17 wherein said at least one bandpass filter includes plural ones of said bandpass filter mounted in cascade order.

* * * * *